US010199249B2

(12) United States Patent
Lee et al.

(10) Patent No.: US 10,199,249 B2
(45) Date of Patent: Feb. 5, 2019

(54) TRANSFER UNIT, APPARATUS FOR TREATING SUBSTRATE, AND METHOD FOR TREATING SUBSTRATE

(71) Applicant: SEMES CO., LTD., Chungcheongnam-do (KR)

(72) Inventors: Hyunho Lee, Chungcheongnam-do (KR); Myungchan Cho, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/266,281

(22) Filed: Sep. 15, 2016

(65) Prior Publication Data

US 2017/0092522 A1 Mar. 30, 2017

(30) Foreign Application Priority Data

Sep. 30, 2015 (KR) .................. 10-2015-0138152

(51) Int. Cl.
*H01L 21/677* (2006.01)
*B08B 3/04* (2006.01)
(Continued)

(52) U.S. Cl.
CPC .......... *H01L 21/67742* (2013.01); *B08B 3/04* (2013.01); *H01L 21/6708* (2013.01);
(Continued)

(58) Field of Classification Search
None
See application file for complete search history.

(56) References Cited

U.S. PATENT DOCUMENTS 5,570,987 A * 11/1996 McKenna ......... H01L 21/67373
414/416.01
9,108,320 B2 * 8/2015 Furuichi .............. B25J 15/0616
(Continued)

FOREIGN PATENT DOCUMENTS

CN 101192556 A 6/2008
CN 102160168 A 8/2011
(Continued)

OTHER PUBLICATIONS

Office Action issued by the National Intellectual Property Administration of PRC dated Oct. 8, 2018 in corresponding Chinese Patent Application No. 201610856812.5 with English translation.

*Primary Examiner* — Ronald P Jarrett
(74) *Attorney, Agent, or Firm* — Carter, DeLuca, Farrell & Schmidt, LLP (57) ABSTRACT

An apparatus for treating a substrate, an apparatus for transferring a substrate and a method for transferring a substrate are provided. The substrate treating apparatus comprises a receiving unit having a plurality of vertically arranged substrate supporting members and a transferring unit having an upper transfer member transferring a substrate to the receiving unit. The upper transfer member comprises a first arm and a second that are vertically spaced apart from each other and are independently driven to extend horizontally. A plurality of vertically arranged first hands is connected to the first arm and a single hand is connected to the second arm. According to an embodiment, a plurality of substrates can be transferred to a right position.

11 Claims, 10 Drawing Sheets

(51) Int. Cl.
*H01L 21/67* (2006.01)
*H01L 21/673* (2006.01)

(52) U.S. Cl.
CPC .... *H01L 21/6732* (2013.01); *H01L 21/67173* (2013.01); *H01L 21/67754* (2013.01); *H01L 21/67757* (2013.01); *H01L 21/67766* (2013.01); *H01L 21/67772* (2013.01); *H01L 21/67781* (2013.01)

(56) References Cited

U.S. PATENT DOCUMENTS

| | | | |
|---|---|---|---|
| 2004/0228712 A1 | 11/2004 | Nam et al. | |
| 2008/0124206 A1* | 5/2008 | Choi | H01L 21/67766 414/744.2 |
| 2011/0153062 A1* | 6/2011 | Hong | H01L 21/67253 700/218 |

FOREIGN PATENT DOCUMENTS

| | | |
|---|---|---|
| JP | 3040991 B2 | 5/2000 |
| JP | 2015033737 A | 2/2015 |
| KR | 10-0553685 B1 | 2/2006 |
| KR | 20100059340 A | 6/2010 |
| KR | 10-1015227 B1 | 2/2011 |

\* cited by examiner

FIG. 1

PRIOR ART

TRANSFER UNIT, APPARATUS FOR TREATING SUBSTRATE, AND METHOD FOR TREATING SUBSTRATE

CROSS-REFERENCE TO RELATED APPLICATIONS

A claim for priority under 35 U.S.C. § 119 is made to Korean Patent Application No. 10-2015-0138152 filed on Sep. 30, 2015 in the Korean Intellectual Property Office, the entire contents of which are hereby incorporated by reference.

BACKGROUND OF THE INVENTION

The present invention disclosed herein relates to an apparatus for transferring a substrate and a method for transferring a substrate.

A plurality of processes are carried out in a process treating unit having a plurality of process chambers. Substrates received in a receiving container are transferred to the process treating unit through a buffer unit. The buffer unit temporarily keeps the substrates before transferring the substrate to or after taking out the substrates from the process treating unit, and a transfer unit transfers the substrates between the receiving container and the buffer unit.

Figure 1:
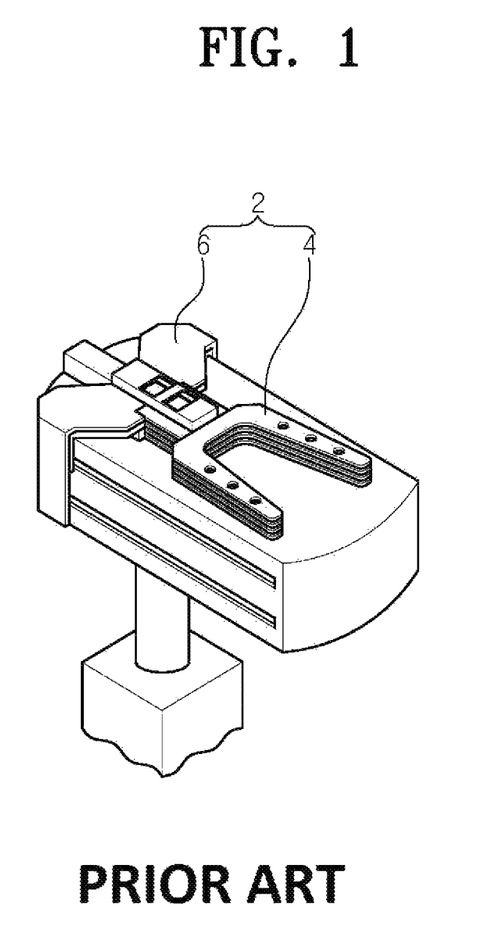
FIG. 1 is a perspective view of general transfer unit.

FIG. 1 is a perspective view of a general transfer unit. Referring to FIG. 1, generally the transfer unit 2 includes a plurality of hands 4. An arm 6 is fixedly connected to each hand 4 as to move in horizontal direction. Therefore, a teaching operation happens for each hand 4 and each hand 4 transfers the substrate to a teaching position.

However, a teaching position of each hand 4 is provided differently, and thus when transferring a plurality of substrates at the same time, there is a difference between a transferring position of the substrate and a right position of the substrate.

SUMMARY OF THE INVENTION

The present invention provides an apparatus and a method for transferring a plurality of substrates to a right position at the same time.

Further, the present invention provides an apparatus and a method for transferring a substrate rapidly.

Exemplary embodiment of the present invention provides an apparatus and a method for transferring a substrate. The apparatus for treating the substrate includes a receiving unit provided with supporting members that support the substrate, the supporting members being arranged vertically and a transfer unit having an upper transfer member that transfers the substrate in the receiving unit, wherein the transfer member is provided with a first arm and a second arm which are spaced apart from each other in the vertical direction and driven to extend along a horizontal direction independently each other, and a plurality of vertically arranged first hands are fixedly connected to the first arm and a single second hand is connected to the second arm. A supporting distance which is a space between adjacent supporting members may be provided regularly, and a hand distance which is a space between adjacent first hands may be provided regularly, and the supporting distance may be the same with the hand distance. A distance between a first hand, which is placed the most adjacently to the second hand, and the second hand may be the same with the supporting distance. The transfer unit may further include a supporting body that supports the first arm and the second arm and a vertically movable elevator shaft that is fixedly connected to the supporting body. The transfer unit may further include a lower transfer unit that is placed under the upper transfer member and transfers the substrate. The lower transfer member includes a third arm and a fourth arm which are spaced apart from each other in the vertical direction and driven to extend along a horizontal direction independently each other. A single third hand is connected to the third arm, and a plurality of vertically arranged fourth hands are fixedly connected to the fourth arm. A space between adjacent fourth hands is the same with the hand space. A distance between a hand, which is placed the most adjacently to the third hand among the fourth hands, and the third hand may be the same with the hand distance. The first hands, the second hand, the third hand, and the fourth hands may be arranged in this order from top to bottom. A distance between the second hand and the third hand may be wider than the hand distance. The first hands and the fourth hands are provided as the number of N (N is natural number of 3 or above), respectively, wherein the transfer unit further includes controller that controls the upper transfer member and the lower transfer member, wherein the controller controls such that the first arm or the fourth arm transfers N number of substrates at the same time when transferring N number of substrates, and wherein the controller controls such that the second arm or the third arm transfers a single substrate when transferring a single substrate. N is 3 and the controller may control such that the second arm and the third arm transfer two substrates when transferring two substrates.

The apparatus for treating the substrate may further include a process treating unit that treats the substrate, wherein the receiving unit may include a receiving container having a receiving space in its internal and one side open at one direction, a door that opens and closes the open one side, and a buffer container having a buffer space in its internal and opposing two sides open at the one direction. The receiving container, the transfer unit, the buffer container, and the process treating unit are arranged along the one direction, wherein the upper transfer member may transfer the substrate from the buffer container to the receiving container, and the lower transfer member may transfer the substrate from the receiving container to the buffer container.

Also the transfer unit may further include a supporting body that supports the first arm, the second arm, the third arm and the fourth arm, respectively and a vertically movable elevator shaft that is fixedly connected to the supporting body. The first hands, the second hand, the third hand, and the fourth hands may be provided as a material including ceramic, respectively.

The transfer unit may further include a controller that controls the first arm and the second arm, wherein the receiving unit includes a buffer container having a buffer space in its internal and two opposing sides open wherein when transferring a plurality of substrates to the buffer space, the controller may control such that one of the second arm and the first arm transfers a substrate to the buffer space and then the other of the second arm and the first arm transfers a substrate.

Also the receiving unit may include a receiving container having a receiving space in its internal and open one side and a door that opens and closes the open one side. The controller may control such that the first arm and the second arm transfer a plurality of substrates to the receiving space at the same time when transferring the plurality of substrates to the receiving space.

The transfer unit is provided with a first arm and a second arm which are spaced apart from each other in a vertical direction and driven to extend along a horizontal direction independently each other, and a plurality of vertically arranged first hands are fixedly connected to the first arm and a single second hand is connected to the second arm.

A hand distance which is a space between adjacent first hands may be provided regularly. A distance between a hand, which is placed the most adjacently to the second hand among the first hands, and the second hand may be the same with the supporting distance. The transfer unit may include a third arm and a fourth arm which are spaced apart from each other vertically. A single third hand is connected to the third arm, and a plurality of vertically arranged fourth hands are fixedly connected to the fourth arm. The third arm and the fourth arm may be driven to extend in a horizontal direction and the first hands, the second hand, the third hand, and the fourth hands may be arranged in this order from top to bottom. A distance between adjacent four hands may be the same with the hand distance. A distance between a hand, which is placed the most adjacently to the third hand among the fourth hands, and the third hand may be the same with the hand distance. The distance between the second hand and the third hand may be wider than the hand distance. The transfer unit may further include a supporting body that supports the first arm, the second arm, the third arm, and the fourth arm, respectively and a vertically movable elevator shaft fixedly connected to the supporting body.

For a method for transferring a substrate by using an apparatus for treating substrate, the transfer unit transfers a substrate in a first mode and a second mode, wherein the first mode controls the movement of the first arm and the second arm depending on a shape of the receiving unit, and the second mode controls the movement of the first arm and the second arm differently depending on the number of substrate to be transferred.

The receiving unit may include a receiving container having one side open and a buffer container having two opposing sides open. The first arm and the second arm transfer a plurality of substrates to the receiving container at the same time when transferring a plurality of substrates to the receiving container When transferring a plurality of substrates to the buffer container, one of the first and the second arm transfers a substrate to the buffer container and then the other of the first arm and the second arm transfers a substrate.

Also the first hands are provided as N (N is natural number of 3 or above). The first arm may transfer N substrates at the same time when transferring N substrates, and the second arm may transfer a single substrate when transferring a single substrate. N is 3 and the transfer unit may further include a single third arm to which a third hand that is closer to the second hand than to the first hand is connected, and the second arm and the third arm may transfer two substrates when transferring two substrates.

According to an embodiment of the present invention, a plurality of the first hands is fixedly connected to a first and can move at the same time, and thus a plurality of substrates can be transferred to a right position at the same time.

DETAILED DESCRIPTION

Various example embodiments will be described more fully hereinafter with reference to the accompanying drawings, in which some example embodiments are shown. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Therefore, features of the drawings are exaggerated to emphasize definite explanation.

Embodiments of the present invention will be explained in detail referring to FIGS. 2-11 hereinafter.

Figure 2:
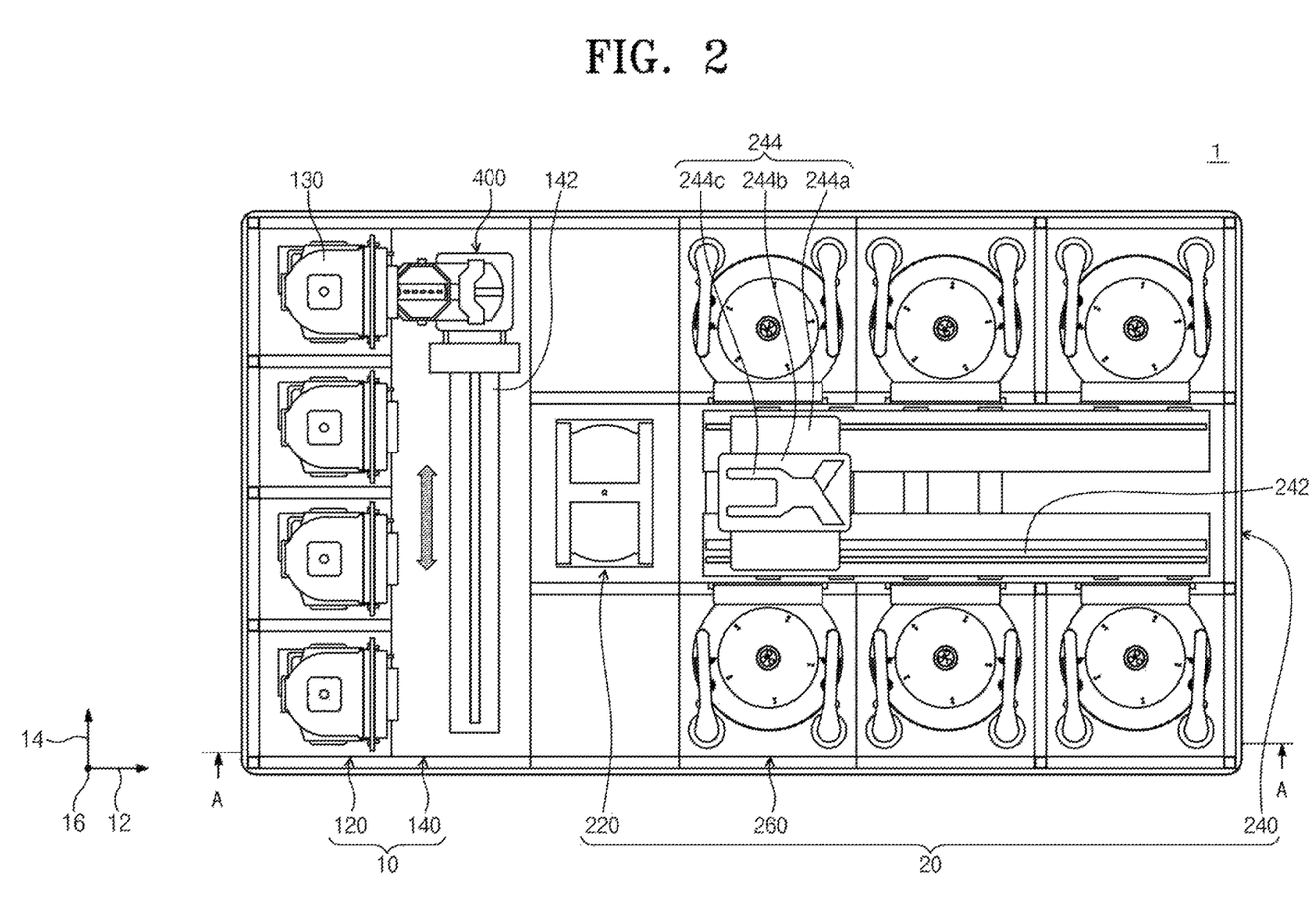
FIG. 2 is a view illustrating an apparatus for treating a substrate in accordance with an embodiment of the present invention.
Figure 3:
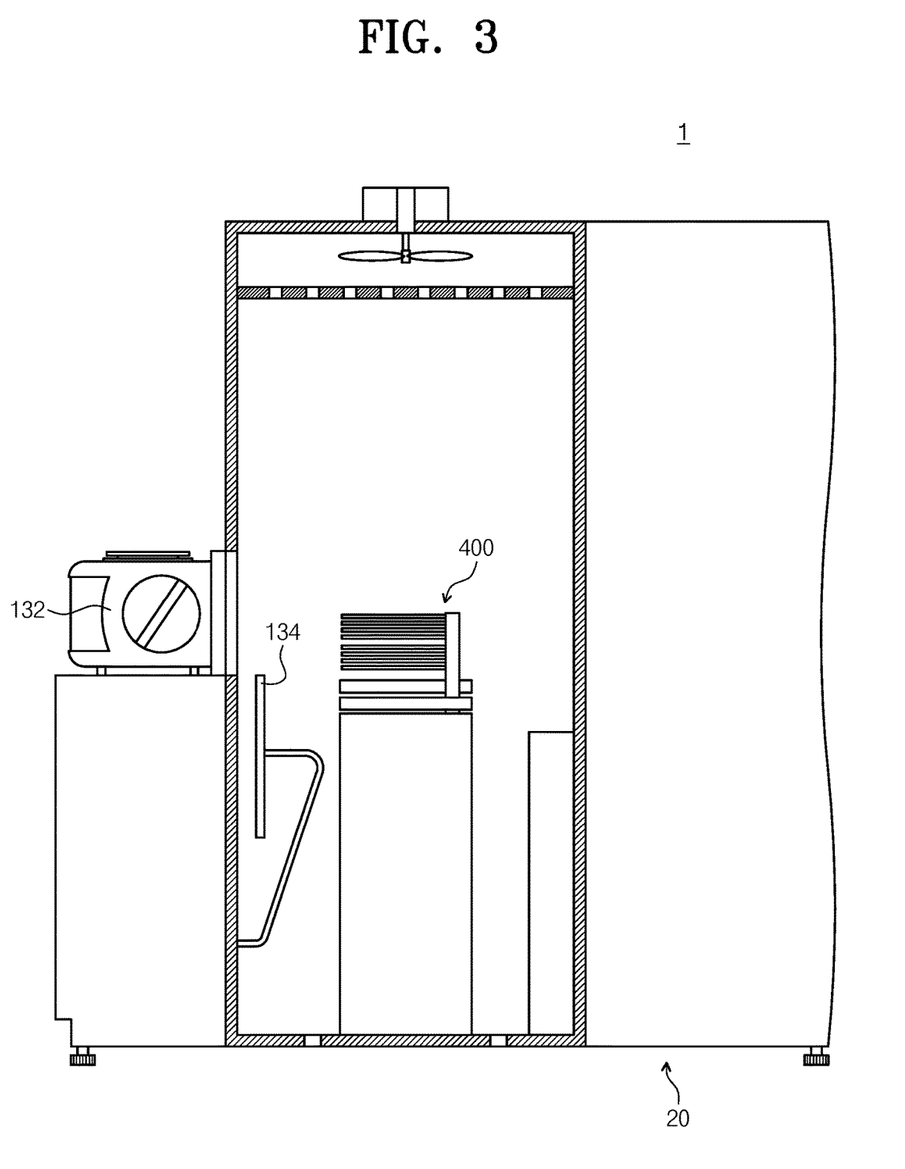
FIG. 3 is a cross sectional view of the index module of FIG. 2 taken from the A-A direction.

FIG. 2 is a plan view of an apparatus for treating a substrate in accordance with an embodiment of the present invention and FIG. 3 is a cross sectional view of the index module of FIG. 2. Referring to FIGS. 2 and 3, a substrate treating apparatus 1 includes an index module 10 and a process treating module 20. The index module 10 includes a road port 120 and a transfer frame 140. The road port 120, the transfer frame 140, and the process treating module 20 are arranged in a row sequentially. A direction which the road port 120, the transfer frame 140, and the process treating module 20 are arranged sequentially is referred to as a first direction 12, when viewed from a top side, a direction perpendicular to the first direction 12 is called as a second direction 14, and a direction perpendicular to a plan defined by the first direction 12 and the second direction 14 is referred to as a third direction 16.

Figure 4:
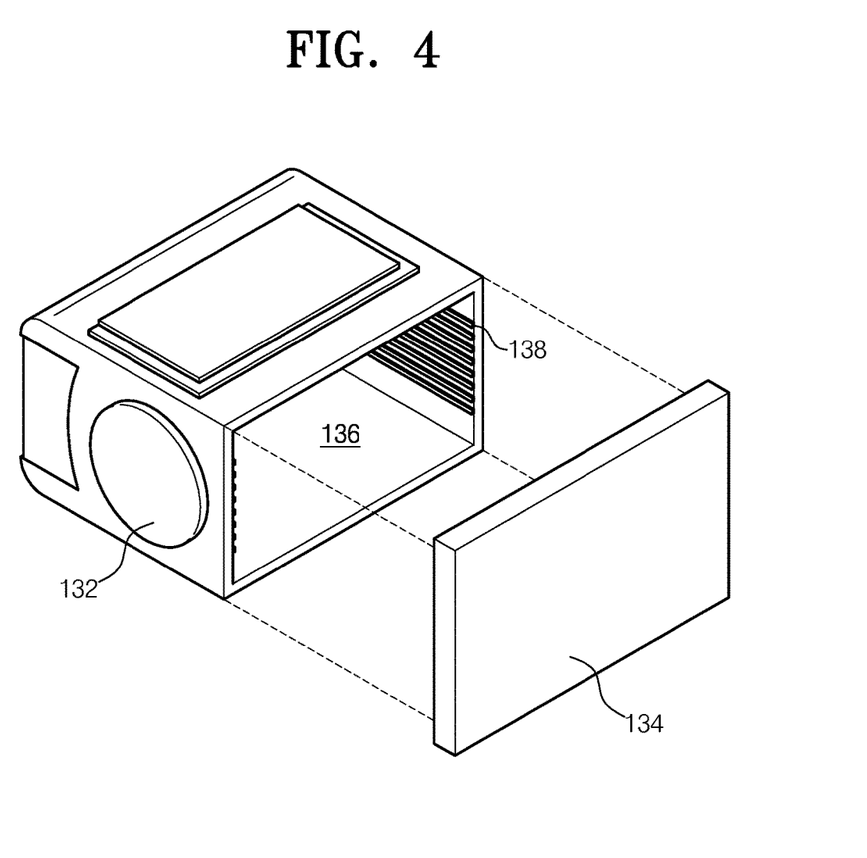
FIG. 4 is a perspective view of the receiving unit of FIG. 2.

A plurality of road ports 120 are provided and arranged in a row along the second direction 14. The number of the road port 120 may be increased or decreased depending on the process effectiveness of the process treating module 20 and requirement of footprint. On each road port 120, a carrier 130 is safely seated. According to an embodiment, the carrier 130 may be provided as a receiving unit that could receive a substrate W in its internal. The receiving unit may use front opening unified pod; FOUP. FIG. 4 is a perspective view of the carrier of FIG. 2. Referring to FIG. 4, the carrier 130 includes a receiving container 132 and a door 134. The receiving container 132 has open one side, e.g., one side of the receiving container 132 is open. In internal of the receiving container 132, a receiving space 136 is formed. The receiving space 136 may be provided to receive a plurality of substrates W. In the receiving space 136, a plurality of supporting members 138 are provided. Supporting members 138 are arranged separate from each other in up and down direction. For example the supporting members 138 may be provided at the two opposing inner sides, respectively. A distance between two adjacent supporting members 138 are provided the same with each other, i.e., the supporting members 138 are regularly spaced apart from each other. The supporting members 138 may be provided as a plurality of slots to receive substrates W horizontally. For example, the supporting member 138 may include two slots that are facing each other horizontally. Each slot is placed in opposing inner sides of the receiving container 132 respectively.

The transfer frame 140 transfers substrate between the buffer unit 220 and the carrier 130 safely seated on the road port 120. The transfer frame 140 is provided with an index rail 142 and a transfer unit 400. The index rail 142 is provided such that the lengthwise direction thereof is parallel with the second direction 14. The transfer unit 400, 144 are movably installed on the index rail 142, such that the transfer unit may move linearly along the index rail 142.

Figure 5:
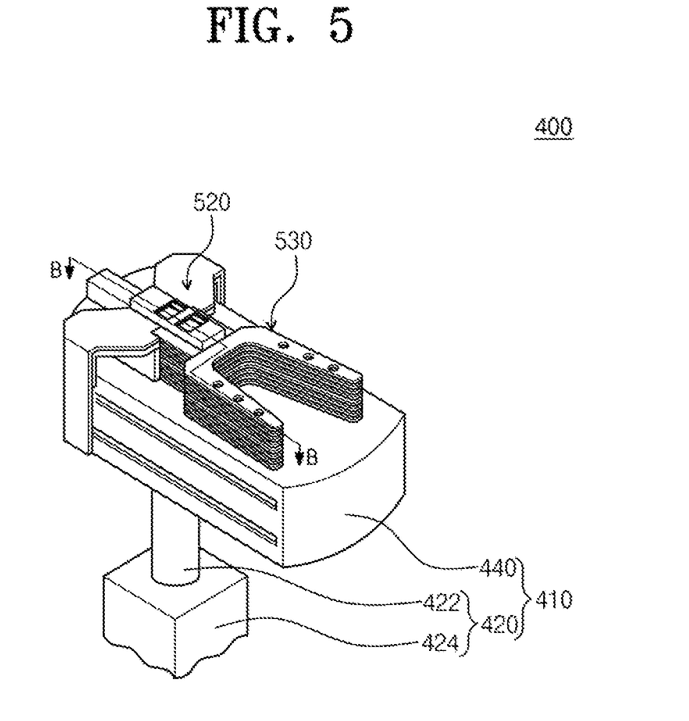
FIG. 5 is a perspective view of the transfer unit of FIG. 2.
Figure 6:
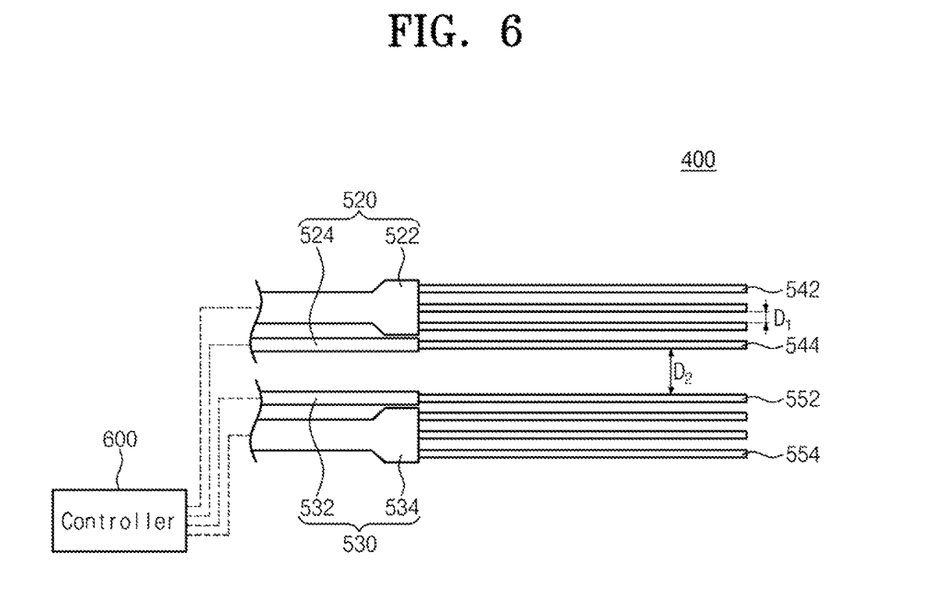
FIG. 6 is a cross sectional view of the arm and the hand of FIG. 5 taken from the B-B direction.

FIG. 5 is a perspective view of the transfer unit of FIG. 2 and FIG. 6 is a cross sectional view of the arm and the hand of FIG. 5. Referring to FIGS. 5 and 6, the transfer unit 400 includes a driving member 410, an upper transfer unit 520, a lower transfer member 530, and a controller 600. The driving member 410 vertically moves and axially rotates the upper transfer unit 520 and the lower transfer member 530. The driving member 410 includes an elevator member 420 and a supporting body 440. The elevator member 420 includes a connection block 424 and an elevator shaft 422. The connection block 424 is installed on the index rail 142. The connection block 424 may move linearly along the lengthwise direction of the index rail 142. The elevator shaft 422 connects the supporting body 440 and the connection block 424 with each other. The elevator shaft 422 is installed on the top side of the connection block 424. The elevator shaft 422 has a lengthwise direction in up and down direction. The length of the elevator shaft 422 may be controlled as up and down direction, i.e., the elevator shaft 422 may extend vertically. Also, the elevator shaft 422 may rotate on its central axis.

The supporting body 440 is fixedly connected on top of the elevator shaft 422 of the elevator member 420. The supporting body 440 may move vertically (upward and downward) and rotate around the vertical axis by the elevator shaft 422. On side of the supporting body 440, a guide rail is installed. A plurality of guide rails may be provided. The guide rails have lengthwise directions parallel with each other. The lengthwise direction of the guide rail is provided to be horizontal direction. Each of the guild rails is installed on a different position from each other of the supporting body 440. In each guide rail, different arms 522, 524, 532, 534 are installed. For example, four guide rails may be provided and two guide rails may be provided in one side and the other side of the supporting body 440, respectively. In the guide rail provided on the one side of the supporting body 440, arms 522, 524 of the upper transfer member 520 may be installed, and in the guide rail provided on the other side of the supporting body 440, arms 532, 534 of the lower transfer member 530 may be installed. In each guide rail, a driving motor (not drawn) is installed, and each driving motor (not drawn) may be controlled independently. Therefore a plurality of arms 522, 524, 532, 534 can be driven independently to extend in the horizontal direction.

The upper transfer member 520 transfers substrate W from the buffer unit 220 to the carrier 130 and the lower transfer member 530 transfers substrate W from the carrier 130 to the buffer unit 220. This could prevent particle generated from substrate W of before processing during carrying in and out of substrate W, from adhering to substrate W of after processing.

The upper transfer member 520 transfers one or more substrates W. The upper transfer member 520 may transfer substrate W along the first direction 12 by moving forward and backward. The upper transfer member 520 includes the first arm 522 and the second arm 524. The first arm 522 has a bar shape extending horizontally. The first arm 522 is movably installed on the guide rail, and may move horizontally along the lengthwise direction of the guide rail. On end of the first arm 522, N (N is natural number of 3 or above) number of the first hands 542 are fixedly connected. Therefore a plurality of substrates W may be transferred by the first hands 542. The first hands 542 have a board shape having a seat surface where substrate W safely seats on. For example, the first hands 542 may be provided as a board shape of 'Y' or 'U'. The first hands 542 are arranged to be separated as up and down direction, i.e., vertically spaced apart from each other. When viewed from the top, the first hands 542 are overlapped with each other. A hand distance D1 between the adjacent first hands 542 is provided the same, i.e., the first hands are regularly spaced apart from each other. According to an embodiment, the first hands 542 may be provided as three first hands. The hand distance may be provided as the same with a supporting distance. The hand distance may be 10 mm.

The second arm 524 may have a bar shape extending horizontally. The second arm 524 is movably installed on the guide rail, and may move horizontally along the lengthwise direction of the guide rail. On end of the second arm 524, single second hand 544 is fixedly connected. Therefore single substrate W may be transferred by the second hand 544. The second hand 544 places below the lowest first hand among the first hands 542. The second hand 544 faces the first hands. When viewed from the top, the second hand 544 and the first hands 542 are overlapped with each other. A distance between the second hand 544 and the lowest first hand among the first hands 542 is provided as the same with the hand distance. The second hand 544 has the same shape with the first hand.

The lower transfer member 530 transfers one or more substrates W below the upper transfer member 520. The lower transfer member 530 may transfer substrate W along the first direction 12 by moving forward and backward. The lower transfer member 530 includes the third arm 532 and the fourth arm 534. The third arm 532 has a bar shape extending horizontally. The third arms 532 are movably installed on the guide rail, and may move horizontally along the lengthwise direction of the guide rail. On end of the third arm 532, a single third hand 552 is fixedly connected. Therefore a single substrate W may be transferred by the third hand 552. The third hand 552 has the same shape with the first hand 542. The third hand 552 is placed lower than the second hand 544. The third hand 552 faces the second hand 544. When viewed from the top, the third hand 552 and the second hand 544 are overlapped with each other. A distance D2 between the second hand 544 and the third hand 552 is provided as larger than the hand distance.

The fourth arm 534 has a bar shape extending horizontally. The fourth arm 534 is movably installed on the guide rail and may horizontally move along the length direction of the guide rail. On end of the fourth arm 534, N (N is natural number of 3 or above) number of the fourth hands 554 are fixedly connected. Therefore a plurality of substrates W may be transferred by the fourth hands 554. Each of the fourth hands 554 has the same shape with the first hands 542. The plurality of fourth hands 554 are placed lower than the third hand 552. The fourth hands 554 face the third hand 552. The fourth hands 554 are arranged to be separated as up and down direction, i.e., the fourth hands 554 are vertically spaced apart from each other. When viewed from the top, the fourth hands 554 are overlapped with each other. A hand distance between the adjacent fourth hands 554 is provided as the same with each other, i.e., the fourth hands are regularly spaced apart from each other. A distance between the third hand 552 and the highest hand among the fourth hands 554 is provided as the same with the hand distance of the fourth hands. According to an embodiment, the fourth hands 554 may be provided as three fourth hands.

The first hands 542, the second hand 544, the third hand 552, and the fourth hands 554 are arranged in this order from top to bottom. For example, the first hands 542, the second hand 544, the third hand 552, and the fourth hands 554 may be provided as a material including ceramic, respectively.

A controller 600 may control the upper transfer member 520 and the lower transfer member 530 as to transfer the substrate W in the first mode or the second mode. The first mode controls the movement of the arms 522, 524 differently depending on a kind of unit in which the substrate is received, and the second mode controls the movement of the arms 532, 534 differently depending on the number of substrate W to be transferred.

Referring back to FIG. 2, the process treating module 20 includes a buffer unit 220, a transfer chamber 240, and a process chamber 260. The transfer chamber 240 is arranged such that the lengthwise direction thereof is parallel with the first direction 12. In the both sides of the transfer chamber 240, process chambers 260 are arranged respectively. In the one side and the other side of the transfer chamber 240, process chambers 260 are provided to be symmetry based on the transfer chamber 240. In one side of the transfer chamber 240, a plurality of process chambers 260 are provided. Some of the process chambers 260 are arranged along lengthwise direction of the transfer chamber 240. Also, some of process chambers 260 are arranged vertically, i.e., stacked each other. That is, in one side of the transfer chamber 240, a plurality of process chambers 260 may be provided as A×B array. In here, A is the number of the process chamber 260 which is provided along the first direction 12, and B is the number of the process chamber 260 which are provided along the third direction 16. When four or six process chambers 260 are provided on one side of the transfer chamber 240, the process chambers 260 may be arranged in 2×2 or 3×2 array. The number of the process chamber 260 may be increased or decreased. According to an embodiment, the process chamber 260 may be provided only on one side of the transfer chamber 240. According to an embodiment, the process chamber 260 may be provided as a single layer at both sides of the transfer chamber 240.

The buffer unit 220 is arranged between the transfer frame 140 and the transfer chamber 240. A buffer space 226 is defined in an internal of the buffer unit 220. The buffer space 226 provides a space for the substrate W to stay temporarily before and after transferring the substrate between the transfer chamber 240 and the transfer frame 140.

Figure 7:
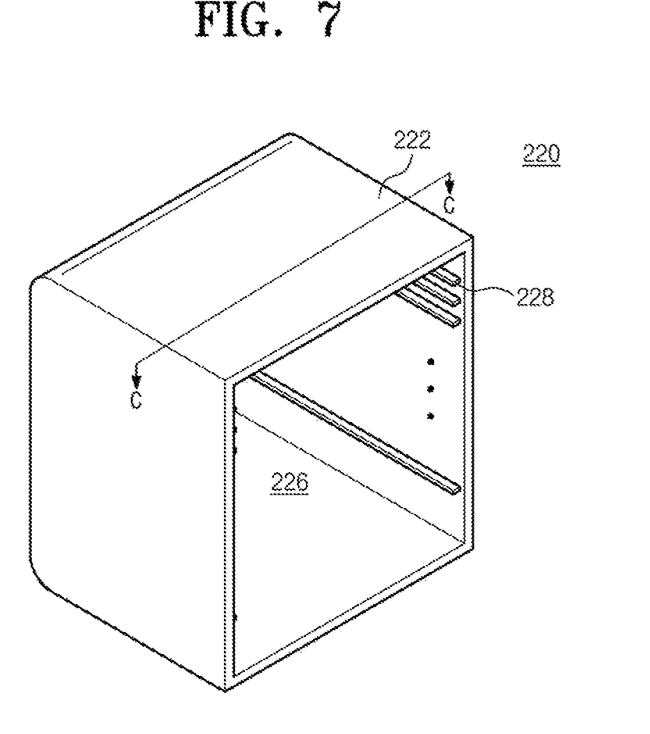
FIG. 7 is a perspective view of the buffer unit of FIG. 2.
Figure 8:
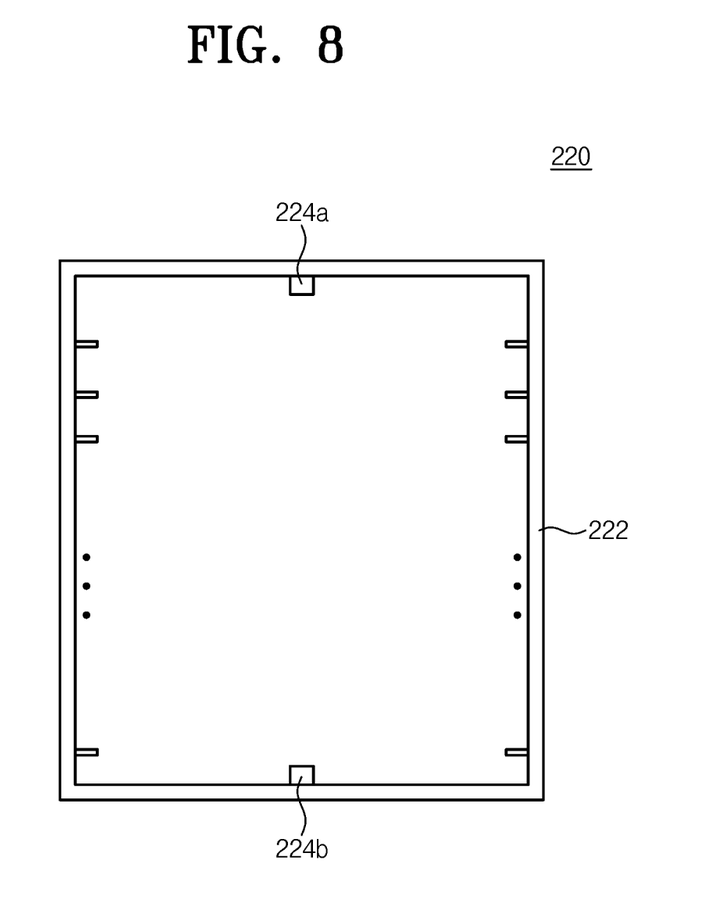
FIG. 8 is a vertically cross sectional view of the buffer unit of FIG. 7 taken from the C-C direction.

FIG. 7 is a perspective view of the buffer unit of FIG. 2, and FIG. 8 is a horizontal cross sectional view of the buffer unit of FIG. 6. Referring to FIGS. 7 and 8, the buffer unit 220 includes a buffer container 222, a supporting member 228, and a sensor 224. The buffer container 222 has a box shape with two opposing sides being open to allow for entry of the substrate. The two opposing open sides of the buffer container 222 may be an entry for the substrate to carry in and out the buffer container 222. One open side of the buffer container 222 faces the transfer frame 140, and the other open side of the buffer container 222 faces the transfer chamber 240.

The supporting member 228 supports the substrate in the buffer space 226. The supporting member 228 is provided as plurality number, and arranged separate from each other along up and down direction, i.e., vertically arranged. The supporting members 228 are provided as many as or more sum of each hand. In this embodiment, it is explained that the supporting members 228 are provided as the same number of the sum of each hands 542, 544, 552, and 554. The supporting member 228 is provided as plurality of slots to receive the substrate W horizontally. For example, the supporting member 228 may include two slots. Slots are placed on opposing inner sides of the buffer container 222 respectively. A distance between some of adjacent supporting members 228 is provided as the same with the hand distance, and a distance between some of adjacent supporting members 228 is provided as larger than the hand distance. According to an embodiment, a distance between adjacent supporting members from top four supporting members is provided as the same with the hand distance, and a distance between adjacent supporting members 228 from bottom four supporting members may be provided as the same with the hand distance. A distance between adjacent supporting members 228 that are placed between the top four supporting members and the bottom four supporting members may be provided as larger than the hand distance.

The sensor 224 senses alignment status of the substrates that are received in the buffer space 226. The sensor 224 includes an optical receiver 224a and an illuminator 224b. The optical receiver 224a and the illuminator 224b are placed vertically opposing each other. The optical receiver 224a receives illuminated light from the illuminator 224b. One of the optical receiver 224a and the illuminator 224b is installed on upper side of the buffer container 222, and the other is installed on bottom side of the buffer container 222. Each optical receiver 224a and the illuminator 224b may be provided as plurality number, and placed near each open sides of the buffer container 222. Alternatively optical receiver 224a and the illuminator 224b may be provided as singularly, and may be placed adjacent one open side of the buffer container 222.

The transfer chamber 240 transfers the substrate W between the buffer unit 220 and the process chamber 260, and between process chambers 260. The transfer chamber 240 is provided with a guide rail 242 and a main robot 244 (see FIG. 2). The guide rail 242 is arranged such that the lengthwise direction of the guide rail 242 is parallel with the first direction 12. The main robot 244 is installed on the guide rail, and move linearly along the first direction 12 on the guide rail 242. The main robot 244 has a base 244a, a body 244b, and a main arm 244c. The base 244a is movably installed on the guide rail 242. The body 244b is connected to the base 244a. The body 244b is provided as to move along the third direction 16 on the base 244a. Also, the body is provided as to rotate on the base 244a. The main arm 244c is connected to the body 244b, and is provided as to move forward and backward to the body 244b. The main arm 244c is provided as plurality of numbers, and the plurality of main arm drive independently from each other. The main arms 244c are arranged vertically, i.e., spaced apart from each other along the third direction 16.

The process chamber 260 is provided as a process treating unit 300 performing a cleaning process for the substrate W. The process treating unit 300 may have different structures depending on kind of the cleaning process. However, in internal of the each process chamber 260 the same structure apparatus may be provided. The process chambers 260 may be divided in plurality of groups, and the apparatuses 300 of the same group of the process chamber 260 may be provide with the same structure and the apparatuses 300 that belongs within the different group of the process chamber 260 may be provided with different structure.

Figure 9:
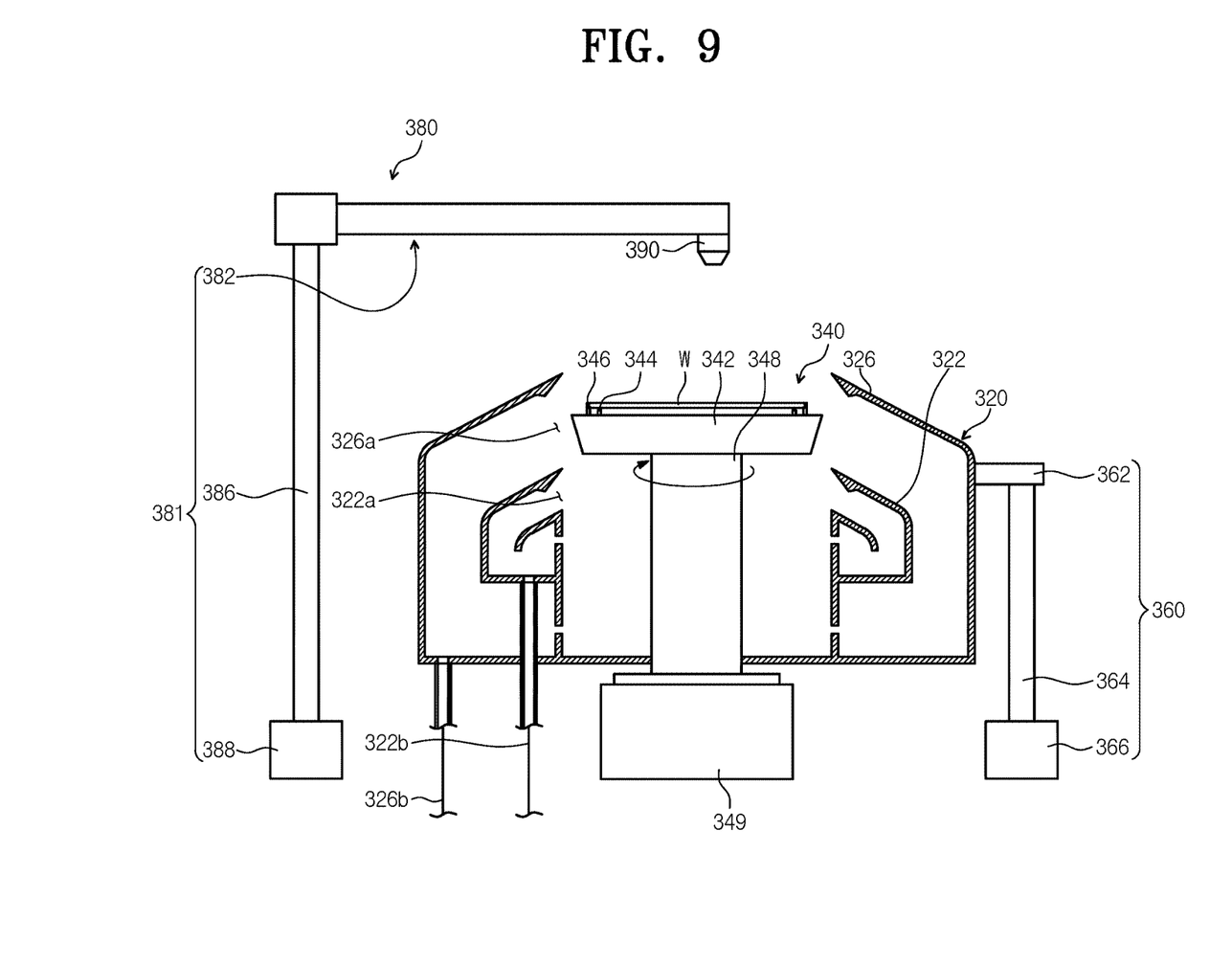
FIG. 9 is a cross sectional view of the process chamber of FIG. 2 taken from the D-D direction.

FIG. 9 is a cross sectional view of the process chamber of FIG. 2. Referring to FIG. 9, the substrate treating apparatus 300 includes a treating container 320, a spin head 340, an elevator unit 360, and a liquid supply unit 380.

The treating container 320 may have a bucket shape with upper side being open. The treating container 320 has an inner collecting container 322 and outer collecting container 326. Each container 322, 326 collects different treatment liquid among treatment liquids used in the process. The inner collecting container 322 is provided as a ring shape that surrounds a spin head 340, and the outer collecting container 326 is provided as a ring shape that surrounds the inner collecting container 322. An inner space 322a is defined in the inner collecting container 322 and functions as a first inlet 322a where treatment liquid flows into the inner collecting container 322. A space 326a defined between the inner collecting container 322 and the outer collecting container 326 and functions as a second inlet 326a where treatment liquid flows into the outer collecting container 326. According to an embodiment, each inlet 322a, 326a may be placed in different heights from each other. Collecting lines 322b, 326b are connected to the bottom side of inlets 322a, 326a respectively. Treatment liquid that flew into each inlet 322a, 326a may be reused through the collecting line 322b, 326b as treatment liquid regeneration system (not drawn) of outside.

The spin head 340 is provided as a substrate supporting unit that rotates and supports the substrate W during process. The spin head 340 has a body 342, a supporting pin 344, a chuck pin 346, and a supporting shaft 348. When viewed from the top body 342 is generally provided such that an upper surface of the top body 342 is provided as a circular shape. The rotatable supporting shaft 348 is fixedly connected to the bottom side of the body 342 and the rotatable supporting shaft 348 is driven by a driving part 349.

The supporting pin 344 is provided as plurality number. The plurality of supporting pins 344 are provided and spaced apart from each other on edge of the upper surface of the body 342 and protrude upward from the body 342. The supporting pins 344 are generally arranged to have a ring shape. The supporting pin 344 supports the back side of the substrate W to be spaced apart from the upper surface of the body 342.

The chuck pin 346 is provided as plurality number. The chuck pin 436 is arranged further apart from a center of the body 342 than the supporting pin 344. The chuck pin 436 is provided as to protrude upward from the body 342. The chuck pin 436 supports lateral part of the substrate W to make substrate W not deviate from a right position to a side direction when the spin head 340 is rotating. The chuck pin 436 is provided to move linearly between outer side and inner side along a radius direction of the body 342. Outer side position is further apart from the center of the body 342 than inner side position. When loading and unloading the substrate W on and from the spin head 340, the chuck pin 346 is placed on the outer side position, and when processing the substrate W, the chuck pin 346 is placed on the inner side position. The inner side position is where the chuck pin 346 and the lateral part of substrate W contacts, and the outer side position is where the substrate W separates with the chuck pin 346.

The elevator unit 360 moves the treatment container 320 linearly up and down direction. As the treatment container 320 moves up and down direction, relative height of the treatment container 320 changes with respect to the spin head 340. The elevator unit 360 has a bracket 362, a moving shaft 364, and a driver 366. The bracket 362 is fixedly connected to an outer wall of the treatment container 320, and the moving shaft 364 which moves to up and down direction by the driver 366 is fixedly connected to the bracket 362. When the substrate is placed on the spin head 340 or when lifted from the spin head 340, the treatment container 320 descends such that the spin head 340 protrudes upward from the treatment container 320. Also, During processing, the height of the treatment container 320 are controlled such that treatment liquid flows into a predetermined collecting container 322, 326 depending on a kind of treatment liquid supplied in substrate W. Selectively, the elevator unit 360 may move the spin head 340 up and down direction.

The liquid supply unit 380 supplies treatment liquid to the substrate W. The liquid supply unit 380 is provided as plurality number and each may supply different kinds of treatment liquids. The liquid supply unit 380 includes a moving member 381 and a nozzle 390.

The moving member 381 moves the nozzle 390 to a processing position and a standby position. In the processing position, the nozzle 390 is located at a position opposite to the substrate W supported on the substrate supporting unit 340, and the standby position refers to a position where nozzle is out of the processing position.

The moving member 381 includes a supporting shaft 386, an arm 382, and a driver 388. The supporting shaft 386 places on one side of a treatment container 320. The supporting shaft 386 has a rod shape and provided such that its lengthwise direction is parallel with the third direction. The supporting shaft 386 is provided as to rotate by the driver 388. The supporting shaft 386 is provided to move up and down. The arm 382 is perpendicularly connected to the top of the supporting shaft 386. At the end of the arm 382, the nozzle 390 is fixedly connected. As the supporting shaft 386 rotates, nozzle 390 together with the arm 382 swings. The nozzle 390 may swing to the processing position and the standby position. When viewed from the top, the nozzle 390 in the processing position may be placed at the same place with the center shaft of the substrate W. For example, treatment liquid may be chemicals. Chemicals may be etching liquid having acid or base property. Chemicals may include $H_2SO_4$, $P_2O_5$, and $NH_4OH$. Selectively the arm 382 may be provided to move forward or backward along its length direction.

Figure 10:
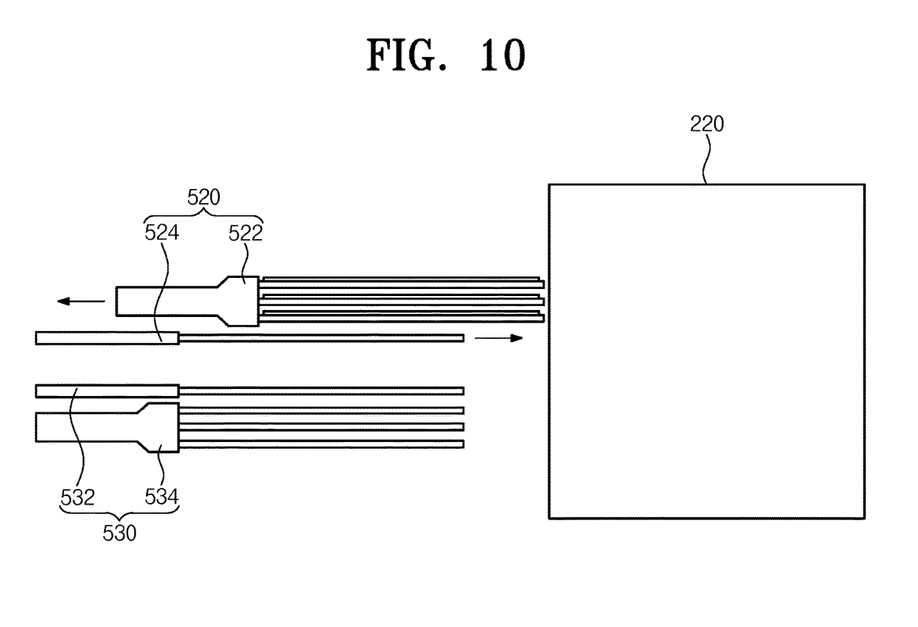
FIG. 10 is a view illustrating the process of transferring substrate in the first mode.

Hereinafter, a method for treating a substrate by using above-described substrate treating apparatus will be described. FIG. 10 is a cross sectional view illustrating a process of transferring substrate in the first mode. According to the first mode when carrying out the substrates W from the buffer space 226, the substrate W is carried out by one of the first arm 522 and the second arm 524, and then by the other arm. According to an embodiment, three substrates W are carried out by the first arm 522 and then one substrate W is carried out by the second arm 524.

Although substrates W are received as unaligned state in the receiving container 132, the unaligned substrates W may be re-aligned when the door closes the receiving container 132. By this occasion, in case that the first hands 542 and the second hand 544 touch and misalign the substrates supported on the supporting member the door can re-align the substrates W. However, in the buffer container two opposing sides are open, and there is no way to align the substrates W received in the buffer space 226. A friction between hand and substrate W received in the buffer space 226 can be minimized by operating the first hands 542 and the second hand 544 sequentially.

Also when carrying the substrates W into the buffer space 226, the substrate W is carried by one of the third arm 532 and the fourth arm 534, and the carried by the other arm. According to an embodiment, one substrate W is carried into the buffer space 226 by the third arm 532, and then three substrates are carried into the buffer space 226 by the fourth arm 534.

Figure 11:
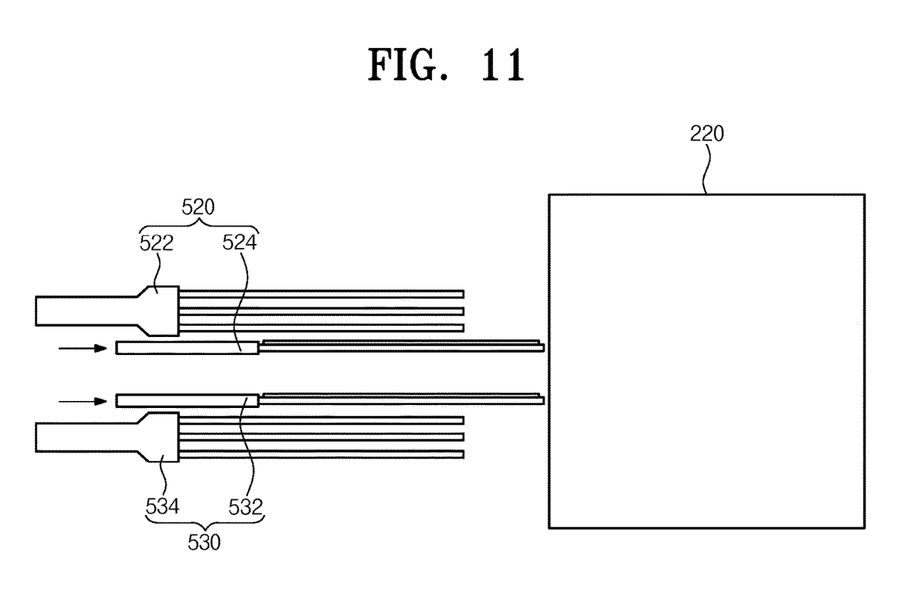
FIG. 11 is a view illustrating the process of transferring substrate in the second mode.

FIG. 11 is a cross sectional view illustrating a process of transferring substrate in the second mode. According to the second mode, when transferring three substrates W, three substrates W are transferred by the first arm 522 or the fourth arm 534 at the same time. However, when transferring a single substrate W, the single substrate W is transferred by the second arm 524 or the third arm 532. Also when transferring two substrates W, the two substrates W are transferred by the second arm 524 and the third arm 532 at the same time. The second hand 544 and the third hand 552 places adjacently to each other. Therefore the traffic line of the second hand 544 and the third hand 552 for carrying in and out the substrate can be minimized.

Different from the stated above, the first mode may control differently the movement of the upper transfer member and the lower transfer member to transfer the substrate to the receiving container, and in the second mode may control the movement of the first arm, the second arm, and the third arm differently depending on the number of the substrate to be transferred.

What is claimed is:

1. An apparatus for treating a substrate comprising:
   a receiver provided with a plurality of supports, the plurality of supports being arranged vertically and supporting a substrate;
   a first guide rail configured to provide a horizontal direction movement;
   a second guide rail configured to provide the horizontal direction movement; and
   a transfer unit having:
      an upper transfer member for transferring a substrate to the receiver, the upper transfer member comprising:
         a first arm installed on the first guide rail;
         a second arm installed on the second guide rail and vertically arranged with the first arm,
         wherein the first arm and the second arm are driven independently to extend horizontally via the first and second guide rails, respectively,
         wherein a plurality of vertically arranged first hands are fixedly connected to the first arm,
         wherein a single second hand is connected to the second arm,
         wherein any two adjacent supports are separated by a first distance, any two adjacent first hands are separated by the first distance, and
         wherein the single second hand and a first hand nearest to the single second hand are separated by the first distance; and
      a lower transfer member for transporting a substrate, the lower transfer member being located below the upper transfer member, the lower transfer member comprising:
         a third arm; and
         a fourth arm vertically arranged with the third arm, wherein the third arm and the fourth arm are independently driven to extend horizontally,
         wherein a single third hand is connected to the third arm, and a plurality of vertically arranged fourth hands are fixedly connected to the fourth arm, and
         wherein any two adjacent fourth hands are separated by a second distance, and the single third hand and a fourth hand nearest to the single third hand are separated by the second distance,
      wherein the first hands, the single second hand, the single third hand, and the plurality of vertically arranged fourth hands are arranged vertically in this order from top to bottom, and
      wherein a distance between the single second hand and the single third hand is longer than the second distance.

2. The apparatus of claim 1, wherein the transfer unit comprises:
   a first support supporting the first arm and the second arm respectively; and
   an elevator shaft fixedly connected to the first support and configured to move vertically.

3. The apparatus of claim 1, wherein a number, N, of each of the plurality of vertically arranged first hands and the plurality of vertically arranged fourth hands is greater than or equal to three, and
   wherein the transfer unit further comprises a controller that controls the upper transfer member and the lower transfer member,
   wherein the controller controls the first arm or the fourth arm to transfer N substrates at the same time, and
   wherein the controller controls the second arm or the third arm to transfer a single substrate.

4. The apparatus of claim 3, wherein N is 3 and the controller controls the second arm and the third arm to transfer two substrates.

5. The apparatus of claim 1, further comprising a process treating unit that treats a substrate,
   wherein the receiver comprises:
      a receiving container having a receiving space and one open side to a predetermined direction;
      a door opening and closing the one open side; and
      a buffer container having a buffer space and opposing two open sides to the predetermined direction,
   wherein the receiving container, the transfer unit, the buffer container, and the process treating unit are arranged along the predetermined direction,
   wherein the upper transfer member transfers a substrate from the buffer container to the receiving container, and
   wherein the lower transfer member transfers a substrate from the receiving container to the buffer container.

6. The apparatus of claim 1, wherein the transfer unit further comprises:
   a first support supporting the first arm, the second arm, the third arm, and the fourth arm; and
   an elevator shaft fixedly connected to the first support and capable of moving vertically.

7. The apparatus of claim 1, wherein each of the plurality of vertically arranged first hands, the single second hand, the single third hand, and the plurality of vertically arranged fourth hands is provided as a material including ceramic.

8. The apparatus of claim 1, wherein the transfer unit further comprises a controller that controls the first arm and the second arm,
   wherein the receiver comprises a buffer container having a buffer space and opposing two open sides, and wherein, when transferring a plurality of substrates to the buffer space, the controller controls one of the first arm and the second arm to transfer a substrate, and then the other of the first arm and the second arm to transfer the substrate.

9. The apparatus of claim 8, wherein the receiver comprises:
a receiving container having a receiving space and one open side; and
a door closing and opening the one open side, and
wherein when transferring a plurality of substrates to the receiving space, the controller controls the second arm and the first arm to transfer the plurality of substrates at the same time.

10. A transfer unit comprising:
a first guide rail configured to provide a horizontal direction movement;
a second guide rail configured to provide the horizontal direction movement;
a first arm installed on the first guide rail;
a second arm installed on the second guide rail, and vertically spaced apart from the first arm each other,
wherein the first arm and the second arm are independently driven to extend horizontally via the first guide rail and the second guide rail, respectively;
a plurality of vertically arranged first hands being fixedly connected to the first arm; and
a single second hand connected to the second arm;
a third arm;
a fourth arm vertically arranged with the third arm;
a single third hand is connected to the third arm; and
a plurality of vertically arranged fourth hands being fixedly connected to the fourth arm,
wherein any two adjacent supports are separated by a first distance, any two adjacent first hands are separated by the first distance,
wherein the single second hand and a first hand nearest to the single second hand are separated by the first distance,
wherein the third arm and the fourth arm are independently driven to extend horizontally,
wherein any two adjacent fourth hands are separated by a second distance, and the single third hand and a fourth hand nearest to the single third hand are separated by the second distance,
wherein the first hands, the single second hand, the single third hand, and the fourth hands are arranged vertically in this order from top to bottom, and
wherein a distance between the single second hand and the single third hand is longer than the second distance.

11. The transfer unit of claim 10, wherein the transfer unit further comprises:
a first support supporting the first arm, the second arm, the third arm, and the fourth arm; and
an elevator shaft fixedly connected to the first support and capable of moving vertically.

* * * * *